United States Patent
Kim et al.

(10) Patent No.: US 8,295,092 B2
(45) Date of Patent: Oct. 23, 2012

(54) NON-VOLATILE MEMORY DEVICE AND MEMORY SYSTEM

(75) Inventors: Chan-ho Kim, Seoul (KR); Sang-Won Hwang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 202 days.

(21) Appl. No.: 12/498,477

(22) Filed: Jul. 7, 2009

(65) Prior Publication Data

US 2010/0020618 A1  Jan. 28, 2010

(30) Foreign Application Priority Data

Jul. 22, 2008  (KR) .................. 10-2008-0071297

(51) Int. Cl.
*G11C 11/36* (2006.01)
*G11C 7/00* (2006.01)

(52) U.S. Cl. ............... 365/185.18; 365/189.11

(58) Field of Classification Search ............ 365/185.18, 365/185.17, 185.11, 189.09
See application file for complete search history.

(56) References Cited

U.S. PATENT DOCUMENTS

| 6,680,865 | B2 | 1/2004 | Watanabe |
| 6,751,133 | B2 | 6/2004 | Kurosaki |
| 7,251,163 | B2 | 7/2007 | O |
| 7,623,370 | B2 * | 11/2009 | Toda et al. .................. 365/163 |
| 7,633,803 | B2 * | 12/2009 | Lee .......................... 365/185.19 |
| 7,656,714 | B2 * | 2/2010 | Jeon et al. ................ 365/185.23 |
| 2005/0104120 | A1 * | 5/2005 | Ichige et al. ................. 257/315 |
| 2008/0158966 | A1 * | 7/2008 | Chen et al. ............... 365/185.16 |
| 2008/0316825 | A1 * | 12/2008 | Hwang et al. ............ 365/185.11 |
| 2008/0316830 | A1 * | 12/2008 | Yang et al. ............... 365/185.18 |

FOREIGN PATENT DOCUMENTS

| JP | 2003-109389 | 4/2003 |
| JP | 2003-123493 | 4/2003 |
| JP | 2006-012401 | 1/2006 |
| KR | 1020030026887 A | 4/2003 |
| KR | 1020030030824 A | 4/2003 |
| KR | 1020050121860 | 12/2005 |

* cited by examiner

*Primary Examiner* — VanThu Nguyen
*Assistant Examiner* — Khamdan Alrobaie
(74) *Attorney, Agent, or Firm* — Volentine & Whitt, PLLC

(57) ABSTRACT

A nonvolatile memory device includes a plurality of memory cells connected to a wordline and arranged in a row direction, bitlines connected to the plurality of memory cells, respectively, and a bitline bias circuit configured to separately control bias voltages provided to the bitlines according to positions of the memory cells along the row direction.

18 Claims, 12 Drawing Sheets

NON-VOLATILE MEMORY DEVICE AND MEMORY SYSTEM

PRIORITY CLAIM

A claim of priority under 35 U.S.C §119 is made to Korean Patent Application No. 10-2008-0071297, filed Jul. 22, 2008, the entirety of which is herein incorporated by reference.

BACKGROUND AND SUMMARY

The present invention generally relates to semiconductor memory devices and, more specifically, the present invention relates to nonvolatile memory devices and to memory systems including the same.

Semiconductor memory devices are generally classified as either volatile memory devices or nonvolatile memory devices. Volatile memory devices are characterized by the loss of stored data in the absence of supplied power, while the nonvolatile memory devices retain their stored data even when the supply of power is interrupted. Examples of volatile memory devices include SRAM, DRAM, SDRAM and the like. Examples of nonvolatile memory devices include ROM, PROM, EPROM, EEPROM, flash memory devices, PRAM, MRAM, RRAM, FRAM and the like. Among these, flash memory devices are generally classified as either NOR-type flash memory devices or NAND-type flash memory devices.

In the meantime, the wordlines of memory devices are typically made of polysilicon, which has a higher resistance-capacitance (RC) load than metallic conductors. Therefore, when a wordline driver applies an operational voltage to a polysilicon wordline, a portion of the wordline which is relatively close to a wordline driver reaches a target voltage more rapidly than a portion of the wordline which is relatively far from the wordline driver.

As mentioned above, the present invention generally relates to nonvolatile memory devices and to memory systems including the same.

In an exemplary embodiment, the nonvolatile memory device may include a plurality of memory cells connected to a wordline and arranged in a row direction, bitlines connected to the plurality of memory cells, respectively, and a bitline bias circuit configured to separately control bias voltages provided to the bitlines according to positions of the memory cells along the row direction.

In another exemplary embodiment, the nonvolatile memory device may include a plurality of wordlines, a plurality of bitlines intersecting the plurality of wordlines, a wordline driver configured to select the plurality of wordlines, and a bitline bias circuit configured to separately bias the respective bitlines according to distances between the respective bitlines and the wordline driver.

In yet another exemplary embodiment, a memory system may include a nonvolatile memory device and a controller configured to control the nonvolatile memory device, the nonvolatile memory device including a memory cell array including a plurality of wordlines and a plurality of bitlines, a row decoder configured to select the plurality of wordlines, and a bitline bias circuit configured to separately bias the respective bitlines according to distances between the respective bitlines and the row decoder during a program operation.

DETAILED DESCRIPTION OF THE EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
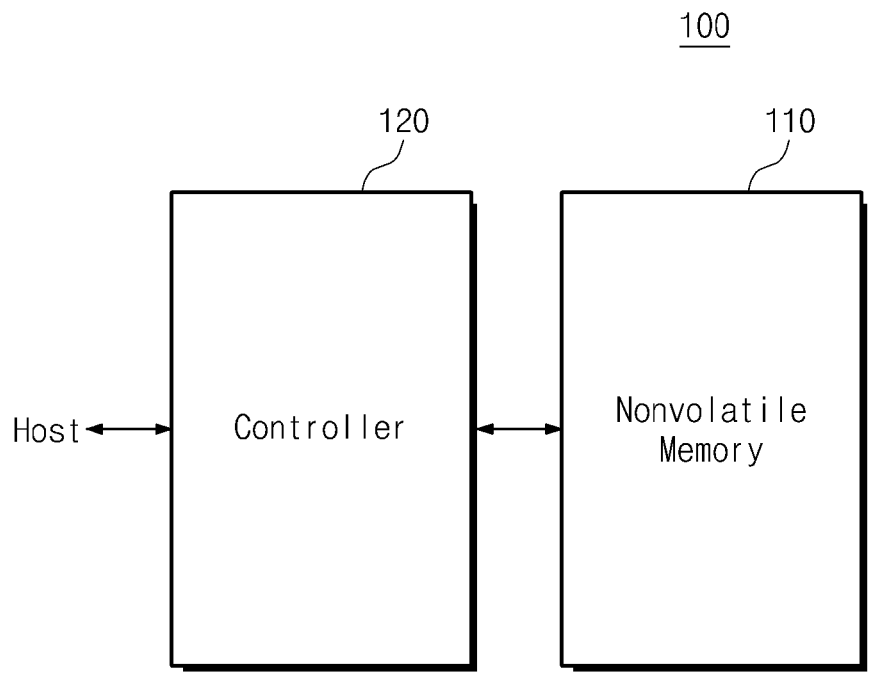
FIG. 1 is a block diagram of a memory system according to an embodiment of the present invention.

FIG. 1 is a block diagram of a memory system 100 according to an embodiment of the present invention. The memory system 100 includes a nonvolatile memory device 110 and a controller 120.

As will be described in more detail herein, the nonvolatile memory device 110 separately controls bias voltages applied to bitlines, and further, separately biases the respective bitlines according to distances between the respective bitlines and a wordline driver.

The controller 120 is connected to a host and the nonvolatile memory device 110. The controller 120 transfers data read from the nonvolatile memory device 110 to the host, and stores data transferred from the host in the nonvolatile memory device 110.

The controller 120 may include conventional components such as a RAM, a processing unit, a host interface, and a memory interface. The RAM may be used as an operational memory of the processing unit. The processing unit may control general operations of the controller 120. The host interface may include a protocol for data exchange between the host and the controller 120. For example, the controller 120 may be configured to communicate with the outside world (e.g., the host) through one of various interface protocols such as USB, MMC, PCI-E, ATA (Advance Technology Attachment), Serial-ATA, Parallel-ATA, SCSI, ESDI, and IDE (Integrated Drive Electronics). The memory interface may interface with the nonvolatile memory device 110. The controller 120 may further include an error correction code (ECC) block, which may detect and correct an error in data read from the nonvolatile memory device 110.

The controller 120 and the nonvolatile memory device 110 may be integrated into one semiconductor device. In an exemplary embodiment, the controller 120 and the nonvolatile memory device 110 are integrated into one semiconductor device to constitute a memory card such as, for example, a PC card (PCMCIA), a compact flash card (CF), a smart media card (SM/SMC), a memory stick, a multimedia card (MMC, RS-MMC, MMCmicro), an SD card (SD, miniSD, and microSD), a universal flash storage (UFS), and the like.

In another exemplary embodiment, the controller 120 and the nonvolatile memory device 110 are integrated into one semiconductor device to constitute a solid-state disk/drive (SSD). In this case the memory system 100 may be used as an SSD which exhibits an enhanced operation speed in communication with the host.

Figure 2:
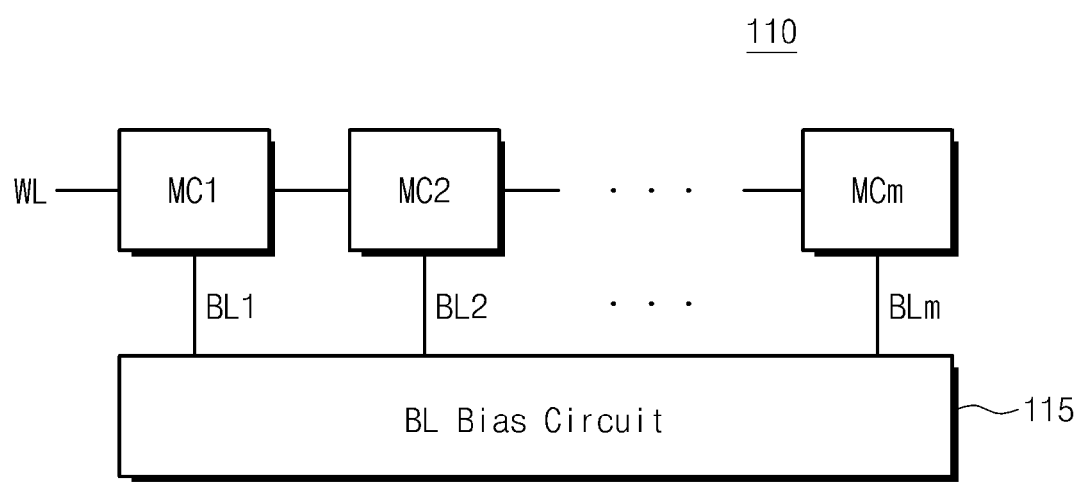
FIG. 2 is a block diagram of components of a non-volatile memory device shown in FIG. 1 according to an embodiment of the present invention.

FIG. 2 is a block diagram illustrating components of the nonvolatile memory device 110 shown in FIG. 1. As shown, the nonvolatile memory device 110 includes a plurality of memory cells MC1-MCm and a bitline bias circuit 115. The plurality of memory cells MC1-MCm are connected to a wordline, and are further connected to the bitline bias circuit 115 through corresponding bitlines BL1-BLm.

As mentioned previously, the wordline WL of a memory device has a resistance-capacitance (RC) load, and therefore a portion of the wordline WL which is relatively close to a wordline driver reaches a target voltage more rapidly than a portion which is relatively far from the wordline driver. Therefore, it is necessary to delay execution of a program operation until the portion of the wordline WL which is relatively far from the wordline driver reaches the target voltage (program voltage). In the meantime, during this delay in execution of the program operation, the memory cells connected to the portion of the wordline WL located relatively close to the wordline driver are applied with a high program voltage (e.g., a voltage generated by a charge pump). This disadvantageously increases a voltage stress applied to the memory cells which are operationally connected relatively close to the wordline driver via the wordline WL.

In order to address the above-mentioned issues relating to the RC load of the wordline WL, the bitline bias circuit 115 of an embodiment of the present invention separately controls bias voltages applied to bitlines according to the row direction (word line direction) position of the memory cells. That is, the bitline bias circuit 115 separately biases the respective bitlines according to distances between the respective bitlines and the wordline driver.

Hereinafter, the present invention will now described by way of various embodiments. The present invention will be described with respect to, for example, a flash memory device. However, it will be understood that the present invention is not limited to a flash memory device and may be applied to various other nonvolatile memory devices such as, for example, ROM, PROM, EPROM, EEPROM, PRAM, MRAM, RRAM, and FRAM.

Figure 3:
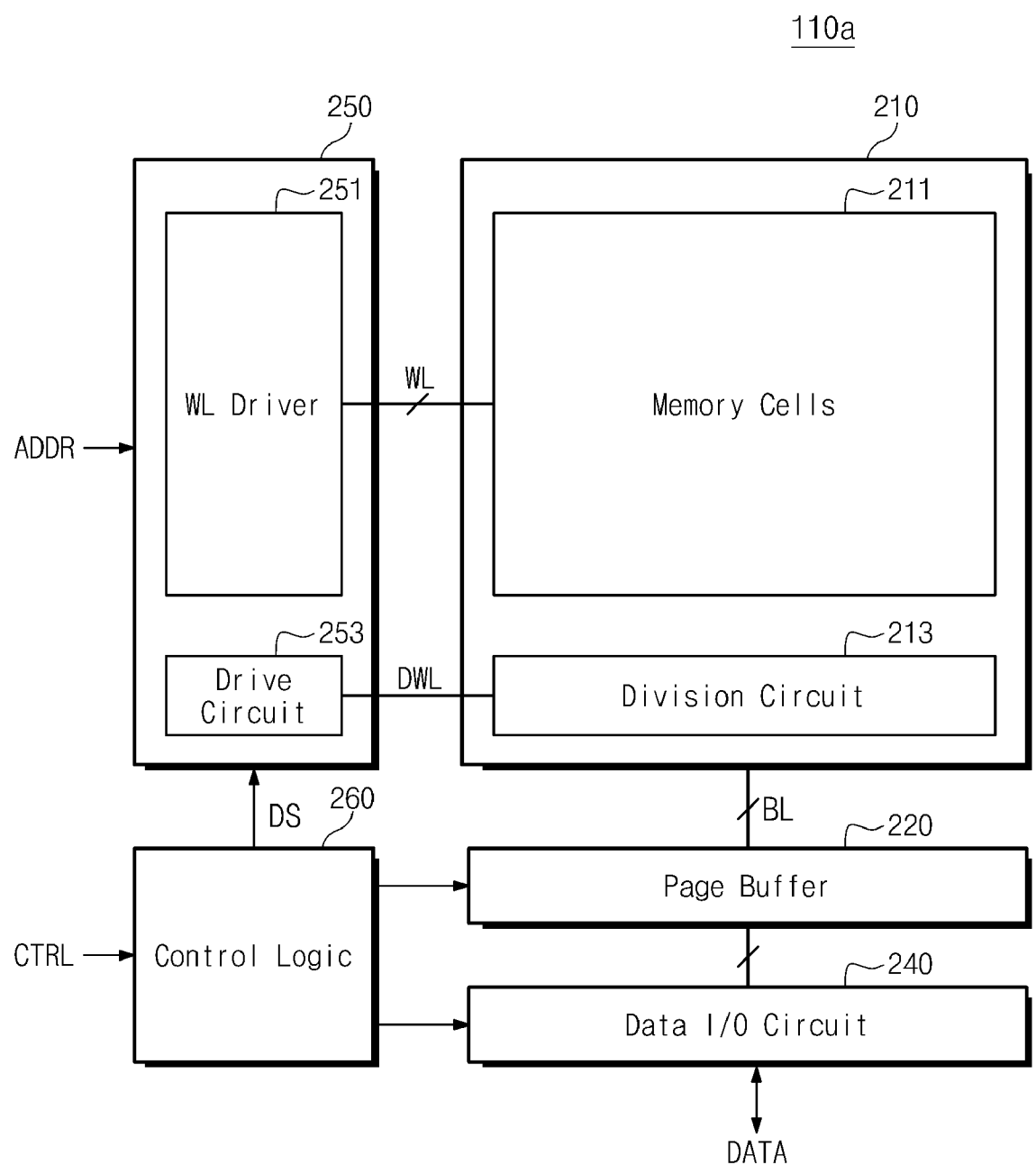
FIG. 3 is a block diagram of a flash memory device according an embodiment of the present invention.

FIG. 3 is a block diagram of a flash memory device 110*a* according to a first embodiment of the present invention. The flash memory device 110*a* of this example includes a memory cell array 210, a page buffer 220, a data input/output circuit 240, a row decoder 250, and a control logic 260.

The memory cell array 210 is connected to the page buffer 220 through bitlines BL and is connected to the row decoder 250 through wordlines WL and a conductive line. The conductive line may be, for example, a dummy wordline DWL. The memory cell array 210 includes memory cells and a division circuit 213. The memory cells 211 store data transferred from the page buffer 220 in response to the control of the row decoder 250, and transfer the stored data to the page buffer 220 in response to the control of the row decoder 250. Memory cells are arranged at intersections of the plurality of bitlines BL and the plurality of wordlines WL, respectively.

The division circuit 213 receives a drive voltage VDBL from the row decoder 250 through the conductive line (e.g., dummy wordline DWL). The division circuit 213 divides the drive voltage VDBL and applies the divided drive voltage to the bitlines BL.

The page buffer 220 is connected to the memory cell array 210 through the bitlines BL and is connected to the data input/output circuit 240 therethrough. The page buffer 220 operates in response to the control of the control logic 260. The page buffer 220 sets the bitlines BL during program, read, and erase operations, and senses the data stored in the memory cells 211 during the read operation.

The data input/output circuit 240 is connected to the page buffer 220 and operates in response to the control of the control logic 260. The data input/output circuit 240 exchanges data DATA with an external device. The data input/output circuit 240 may exchange data with, for example, the controller 120 shown in FIG. 1. The data input/output circuit 240 transfers externally input write data to the page buffer 220. The data input/output circuit 240 may include components, such as a data buffer and a column pass gate, which are well known in the art.

The row decoder 250 is connected to the memory cell array 210 and the control logic 260 and operates in response to the control of the control logic 260. The row decoder 250 receives an external address ADDR to select wordlines WL1-WLm. The address ADDR may be provided from the controller 120 shown in FIG. 1. The row decoder 250 includes the wordline driver 251 and a drive circuit 253. The wordline driver 251 provides a voltage to the wordlines WL. The wordline driver 251 may apply various voltages, such as a program voltage, a pass voltage, a read voltage, and a ground voltage, to the wordlines WL according to the operation modes. The driver circuit 253 provides the drive voltage VDBL through the conductive line (e.g., dummy wordline DWL). The drive circuit 253 is activated in response to a control signal DS transferred from the control logic 260.

The control logic 260 controls general operations of the flash memory device 110*a*. For example, during a program operation, the control logic activates the control signal DS. The control logic 260 operates in response to an externally input control signal CTRL. The control signal CTRL may be provided from, for example, the controller 120 shown in FIG. 1.

Figure 4:
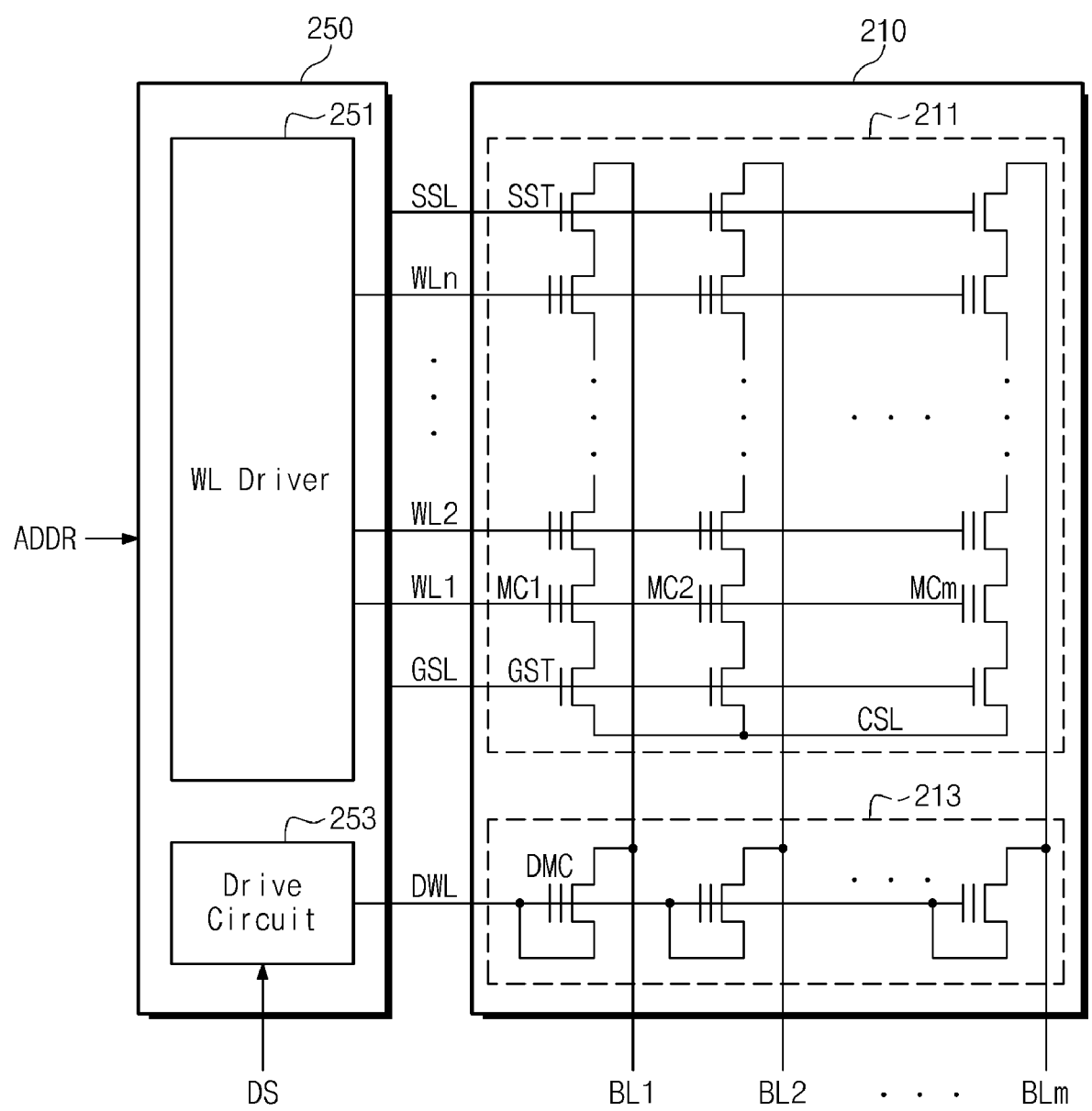
FIG. 4 is a block diagram of a memory cell array and a row decoder shown in FIG. 3 according to an embodiment of the present invention.

FIG. 4 is a block diagram of the memory cell array 210 and the row decoder 250 shown in FIG. 3. The memory cell array 210 include a plurality of NAND strings each including a string selection transistor SST, a ground selection transistor GST, and memory cells MC coupled between the string and ground selection transistors SST and GST. The string selection transistors SST are connected to their corresponding bitlines BL1-BLm through a division circuit 213, respectively. Gates of the string selection transistors SST are connected to the row decoder 250 through a string selection line SSL.

The ground selection transistors GST are connected to a common source line CSL. Gates of the ground selection transistors GST are connected to the row decoder 250 through a ground selection line GSL. Memory cells MC are connected to a wordline driver 251 of the row decoder 250 through their corresponding wordlines WL1-WLn.

The division circuit 213 includes a plurality of cell transistors connected to a conductive line. The conductive line may be, for example, a dummy wordline DWL and be disposed in parallel with wordlines WL1-WLn. The conductive line may be made of, for example, the same polysilicon as the wordlines WL1-WLn. That is, the conductive line may have the same RC load as the wordlines WL1-WLn. The division circuit 213 and the drive circuit 253 constitute a bitline bias circuit 115 shown in FIG. 2.

In an exemplary embodiment, source regions of cell transistors of the division circuit 213 may be electrically connected to control gates thereof, respectively. That is, the cell transistors may be configured to function as diodes. A conductive line may be connected to input terminals of the diodes. Drain regions of the cell transistors, i.e., output terminals of the diodes may be connected to their corresponding bitlines BL1-BLm, respectively. In another exemplary embodiment, cell transistors may be dummy memory cells DMC formed to prevent an error resulting from a step difference between a cell array region and a peripheral circuit region.

The respective dummy memory cell DMC include a charge storage layer. In an exemplary embodiment, the respective dummy memory cells DMC may include the same charge storage layer as respective memory cells MC. The charge storage layer of the respective dummy memory cells DMC may be a floating gate or a charge trap. During an erase operation, a drive circuit may control the dummy memory cells DMC such that they are not erased. For example, during the erase operation, the drive circuit may float a dummy wordline DWL.

FIG. 4 shows that the division circuit 213 includes dummy memory cells DMC each including a charge storage layer such as a floating gate or a charge trap. However, a control gate and the charge storage of the respective dummy memory cells DMC may be electrically connected to each other. In this case, the dummy memory cells DMC may function as an NMOS transistor. Since a source region and a control gate of the respective dummy memory cells DMC are electrically connected to each other, the respective dummy memory cells DMC may function as a diode.

During a program operation, the wordline driver 251 applies a program voltage Vpgm and a pass voltage Vpass to wordlines and the drive circuit 253 provides a drive voltage VDBL to a conductive line. The drive voltage VDBL is provided to bitlines BL1-BLm through their corresponding dummy memory cells DMC.

Figure 5:
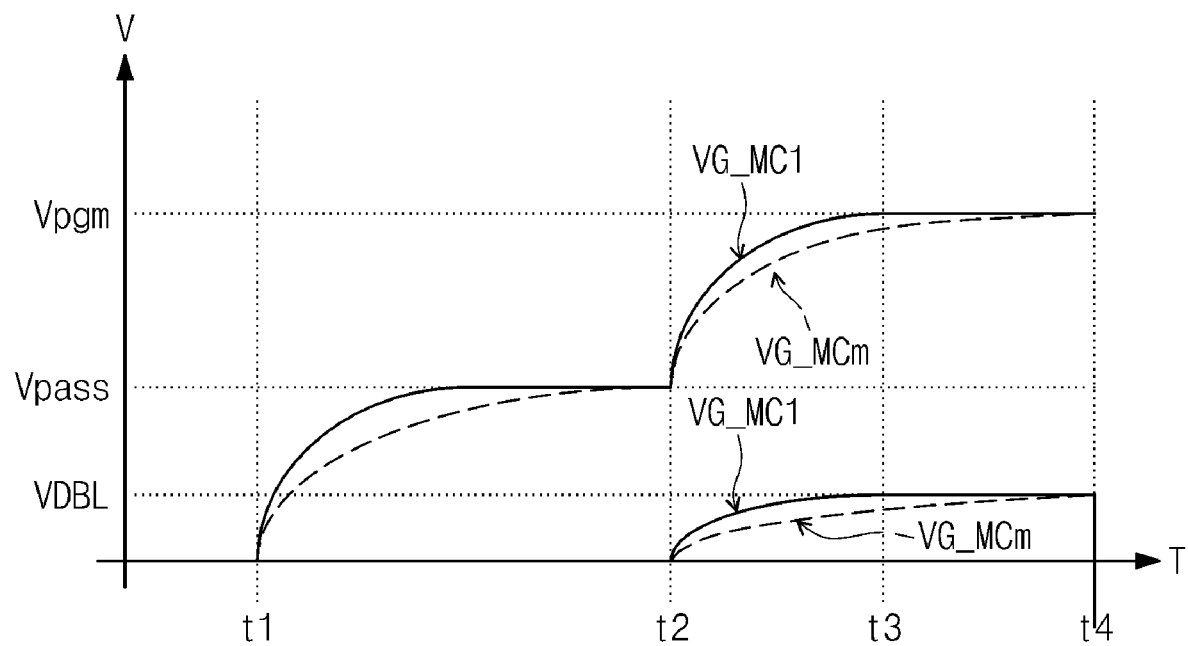
FIG. 5 is a graph illustrating operations of a wordline driver and a drive circuit shown in FIG. 4 according to an embodiment of the present invention.

FIG. 5 is a graph illustrating operations of the wordline driver 251 and the driver circuit 253 shown in FIG. 4. In FIG. 5, the x-axis denotes time T and the y-axis denotes a voltage V. For clarity of explanation, it is assumed that memory cells MC1 and MCm are memory cells to be programmed and the remaining memory cells MC are program-inhibit memory cells.

Referring to FIGS. 4 and 5, a wordline driver 251 applies a pass voltage Vpass to wordlines WL1-WLn at time "t1". The wordlines WL1-WLn start rising from a ground voltage. On the wordlines WL1-WLn, a voltage of a portion which is relatively close to a wordline driver 251 may rise more rapidly than that of a portion which is relatively far from the wordline driver 251 due to the RC load of the wordlines WL1-WLn.

In the figure, a voltage VG_MC1 shown in a solid line represents a voltage applied to a gate of a memory cell MC1, and a voltage VG_MCm shown in a dashed line represents a voltage applied to a gate of a memory cell MCm. Since a distance between the memory cell MC1 and the wordline driver 251 is shorter than that between the memory cell MCm and the wordline driver 251, the gate voltage VG_MC1 of the memory cell MC1 rises more rapidly than the gate voltage VG_MCm of the memory cell MCm.

When gate voltages of memory cells MC1-MCm reach a target voltage (pass voltage Vpass) at time "t2", the wordline driver 251 applies a program voltage Vpgm to a wordline (e.g., WL1) connected to a memory cell to be programmed among wordlines WL1-WLn. A voltage of the wordline WL1 thus starts rising from the pass voltage Vpass.

Since the distance between the memory cell MC1 and the wordline driver 251 is shorter than that between the memory cell MCm and the wordline driver 251, the gate voltage VG_MC1 of the memory cell MC1 rises more rapidly than the gate voltage VG_MCm of the memory cell MCm. If a program operation is executed under the condition that a difference between the gate voltage VG_MC1 and a bitline (BL1) voltage is different from a difference between the gate voltage VG_MCm and a bitline (BLm) voltage, program error may occur.

Therefore, in the absence of a bitline bias circuit (115 of FIG. 2) according to the embodiment of the present invention, i.e., a ground voltage is applied to the bitlines BL1 and BLm to be programmed, a program operation may be executed after the gate voltage VG_MCm of the memory cell MCm reaches the program voltage Vpgm (after time "t4"). For this reason, program time may be delayed and the memory cell MC1 may suffer from a high voltage stress from the wordline WL1.

In order to address the above-mentioned issue, the bitline bias circuit 115 separately controls a bias voltage provided to a bitline BL according to the row direction position of a memory cell MC. Also the bitline bias circuit 115 separately biases respective bitlines BL according to distances between the respective bitlines BL and the wordline driver 251. For example, the bitline bias circuit 115 may control a difference between a bitline voltage and a wordline voltage applied to respective memory cells to be uniform at a plurality of memory cells. The bitline bias circuit 115 may include, for example, a drive circuit 253 and a division circuit 213.

At the time "t2", the drive circuit 115 provides a drive voltage VDBL to a dummy wordline DWL. The drive voltage VDBL is provided to bitlines BL1-BLm through dummy memory cells DMC functioning as diodes. The drive voltage VDBL is lower than a voltage (e.g., power supply voltage Vcc) for program inhibition of the memory cells MC1 and MCm to be programmed. The drive voltage VDBL may be lower than, for example, a voltage for boosting channels of the programmed memory cells MC1 and MCm.

A bitline BL2 connected to a program-inhibited memory cell MC2 is set up with a program inhibit voltage (e.g., power supply voltage Vcc) by a page buffer (220 of FIG. 3). Since the drive voltage VDBL is lower than the program inhibit voltage Vcc, the drive voltage VDBL provided from the drive circuit 253 does not affect the bitline BL2.

The bitlines BL1 and BLm connected to the memory cells MC1 and MCm to be programmed are set up with a ground voltage Vss by the page buffer 220. Thus, the drive voltage VDBL transferred from the drive circuit 253 is transferred to the bitlines BL1 and BLm to be programmed through the diodes constituted by the dummy memory cells DMC.

The drive voltage VDBL is provided to the bitline BL1 and BLm through a dummy wordline DWL. The dummy wordline DWL is formed the same as the wordlines WL1-WLn. That is, the dummy wordline DWL have the same RC load as the wordlines WL1-WLn. Accordingly, a voltage provided to the bitline BL1 through the dummy wordline DWL may rise more rapidly than a voltage applied to the bitline BLm therethrough. Further, a ratio of delay of a bitline (BLm) voltage to delay of a bitline (BL1) voltage may be equal to that of delay of a gate voltage VG_MCm of the memory cell MCm to delay of a gate voltage VG_MC1 of the memory cell MC1.

Accordingly, a difference between the gate voltage VG_MC1 and the bitline (BL1) voltage and a difference between the gate voltage VG_MCm and the bitline (BLm) voltage may be maintained uniformly. It is therefore possible to prevent program error which occurs when a program operation is executed under the condition that the voltage differences are different from each other. When differences between the gate voltages VG_MC1 and VG_MCm and bitline (BL1, BLm) voltages reach a sufficient level to execute a program operation, the program operation may be executed.

As shown in FIG. 5, time "t4" is the time at which the gate voltage VG_MC1 of the memory cell MC1 and the gate voltage VG_MCm of the memory cell MCm reach the same level. That is, in the absence of the bitline bias circuit 115, the program operation may be executed at the time "t4". On the other hand, time "t3" is the time at which, in case where the bitline bias circuit 115 is provided, the differences the gate voltage VG_MC1 of the memory cell MC1 and the gate voltage VG_MCm of the memory cell MCm reach a sufficient level to execute a program operation. That is, in case the bitline bias circuit 115 operates, a program operation may be executed at the time "t3". Thus, program time is reduced to the time "t3" from the time "t4".

Figure 6:
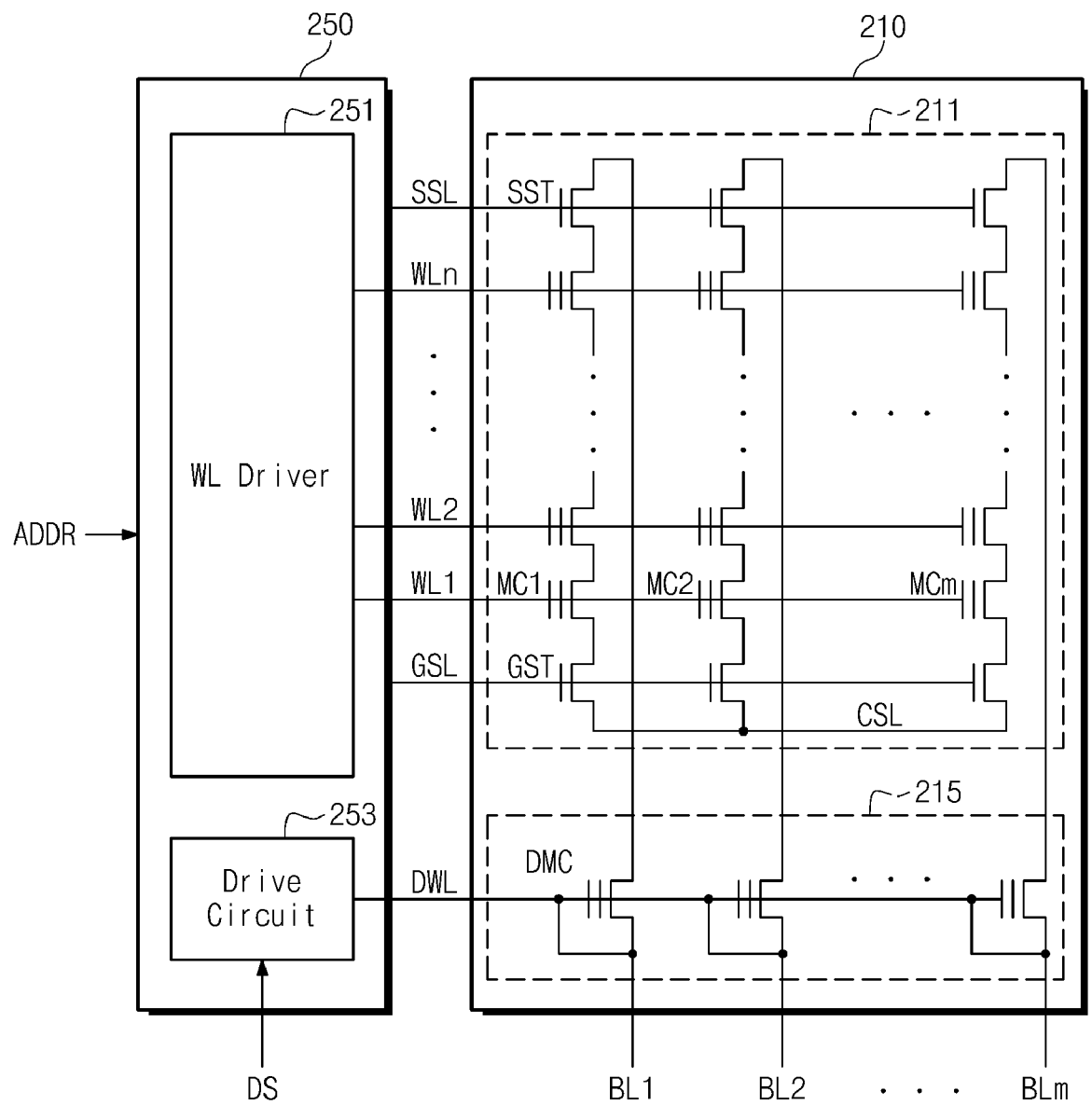
FIG. 6 is a block diagram of another example of the memory cell array and the row decoder shown in FIG. 3 according to an embodiment of the present invention.

FIG. 6 is a block diagram of another example of the memory cell array 210 and the row decoder 250 shown in FIG. 3. A memory cell array 210 and a row decoder 250 shown in FIG. 6 are identical to the memory cell array 210 and the row decoder 250, except that the division circuit 213 of FIG. 4 is substituted with a division circuit 215. Thus, duplicate explanations thereof will be omitted to avoid redundancy.

The division circuit 215 includes a plurality of cell transistors connected to a conductive line. The conductive line may be, for example, a dummy wordline DWL and be disposed in parallel with wordlines WL1-WLn. The conductive line may be made of, for example, the same polysilicon as the wordlines WL1-WLn. That is, the conductive line may have the same RC load as the wordlines WL1-WLn. The division circuit 215 and the drive circuit 253 constitute a bitline bias circuit 115 shown in FIG. 2.

In an exemplary embodiment, source regions of respective cell transistors may be electrically connected to control gates thereof. That is, the cell transistors may be configured to function as diodes. A conductive line may be connected to an input terminal. The diodes are connected to their corresponding bitlines. In another exemplary embodiment, the division circuit 215 may include a plurality of diodes instead of cell transistors.

For example, the conductive line may be a dummy wordline DWL and the cell transistors of the division circuit 215 may be dummy memory cells DMC. The dummy memory cells DMC of the division circuit may be dummy memory cells formed by means of double patterning. Alternatively, the dummy memory cells DMC may be dummy memory cells formed to prevent error resulting from a step difference between a cell array region and a peripheral circuit region.

The respective dummy memory cells DMC include a charge storage layer. In an exemplary embodiment, the respective dummy memory cells DMC may include the same charge storage layer as the memory cells MC. The charge storage layer of the respective dummy memory cells DMC may be a floating gate or a charge trap. During an erase operation, a drive circuit may control the dummy memory cells DMC such that they are not erased. For example, during the erase operation, the drive circuit may float the dummy wordline DWL.

FIG. 6 shows that the division circuit 215 includes dummy memory cells DMC each including a charge storage layer such as a floating gate or a charge trap. However, a control gate and the charge storage of the respective dummy memory cells DMC may be electrically connected to each other. In this case, the dummy memory cells DMC may function as an NMOS transistor. Since a source region and a control gate of the respective dummy memory cells DMC are electrically connected to each other, the respective dummy memory cells DMC may function as a diode.

During a program operation, the wordline driver 251 applies a program voltage Vpgm and a pass voltage Vpass to wordlines, and the drive circuit 253 provides a drive voltage VDBL to a conductive line. The drive voltage VDBL is provided to bitlines BL1-BLm through their corresponding dummy memory cells DMC.

A bitline BL2 connected to a program-inhibited memory cell MC2 is set up with a program inhibit voltage (e.g., power supply voltage Vcc) by a page buffer (220 of FIG. 3). Since the drive voltage VDBL is lower than the program inhibit voltage Vcc, the drive voltage VDBL provided from the drive circuit 253 does not affect the bitline BL2.

Bitlines BL1 and BLm connected to memory cells MC1 and MCm to be programmed are set up with a ground voltage Vss by the page buffer 220. Thus, the drive voltage VDBL transferred from the drive circuit 253 is transferred to the bitlines BL1 and BLm to be programmed, through diodes constituted by the dummy memory cells DMC.

The drive voltage VDBL is provided to the bitlines BL1 and BLm through a dummy wordline DWL. The dummy wordline DWL is formed the same as wordlines WL1-WLn. That is, the dummy wordline DWL has the same RC load as the wordlines WL1-WLn. Accordingly, a voltage provided to the bitline BL1 through the dummy wordline DWL may rise more rapidly than that provided to the bitline BLm through the dummy wordline DWL. Further, a ratio of delay of a bitline (BLm) voltage to delay of a bitline (BL1) voltage may be equal to that of delay of a gate voltage VG_MCm of the memory cell MCm to delay of a gate voltage VG_MC1 of the memory cell MC1.

Accordingly, a difference between the gate voltage VG_MC1 and the bitline (BL1) voltage and a difference between the gate voltage VG_MCm and the bitline (BLm) voltage may be maintained uniformly. It is therefore possible to prevent program error which occurs when a program operation is executed under the condition that the voltage differences are different from each other. When differences between the gate voltages VG_MC1 and VG_MCm and bitline (BL1, BLm) voltages reach a sufficient level to execute a program operation, the program operation may be executed. Thus, program time is reduced.

Figure 7:
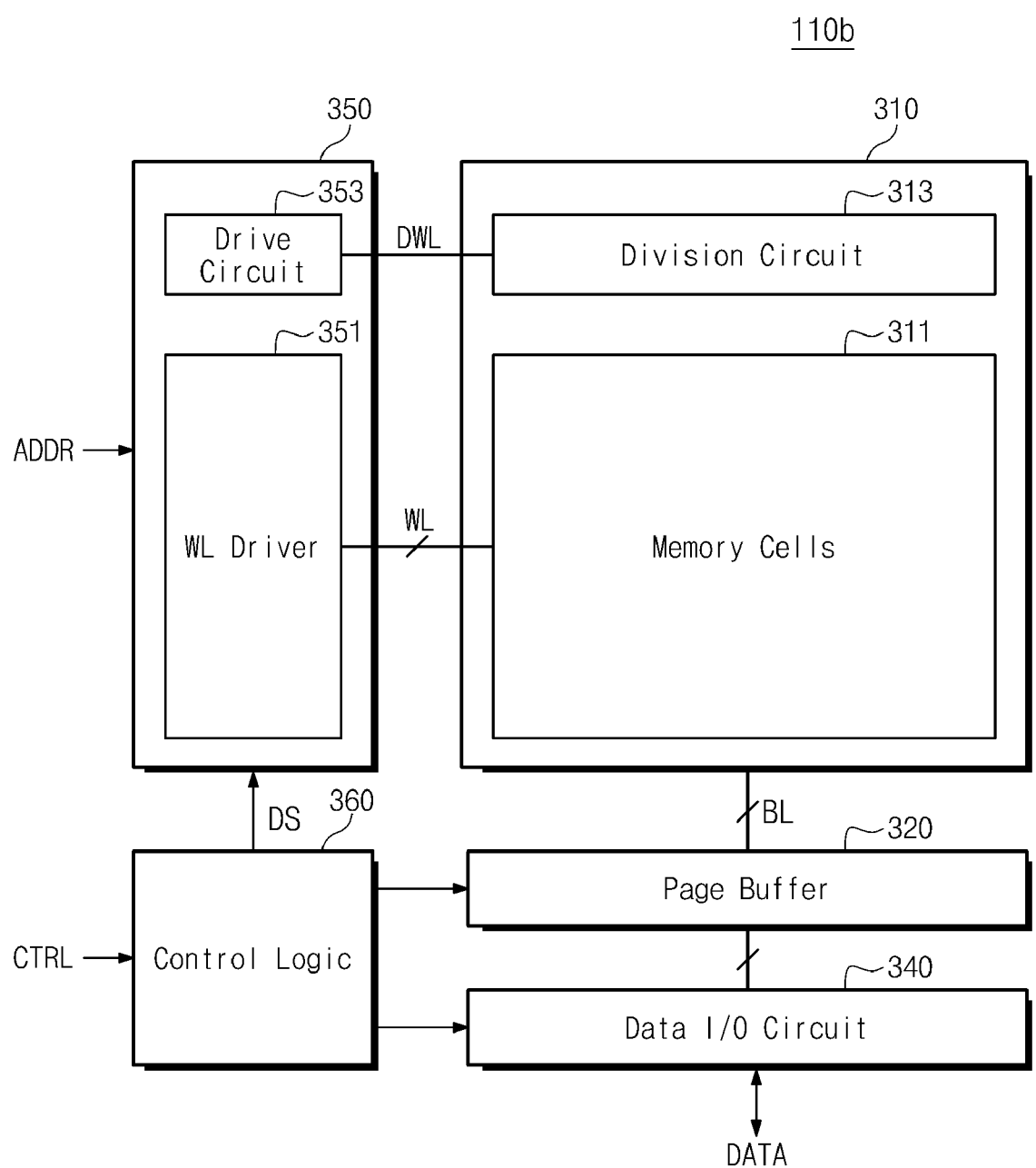
FIG. 7 is a block diagram of a flash memory device according to another embodiment of the present invention.

FIG. 7 is a block diagram of a flash memory device 110b according to another embodiment of the present invention. The flash memory device 110b is the same as the flash memory device 110a shown in FIG. 3, except the memory cell array 210 and a row decoder 250 shown in FIG. 3 are substituted with a memory cell array 310 and a row decoder 350 shown in FIG. 7. Otherwise, the control logic 360, page buffer 320, and I/O circuit 340 function the same as their like-named counterparts of FIG. 3. Thus, duplicate explanations thereof will be omitted to avoid redundancy.

A drive circuit 353 and a division circuit 313 constitute a bitline bias circuit 115 shown in FIG. 2. The bitline bias circuit 115 separately controls bias voltages provided to bitlines according to a row direction position of a memory cell. The bitline bias circuit 115 separately biases the respective bitlines according to distances between the respective bitlines and a wordline driver.

Figure 8:
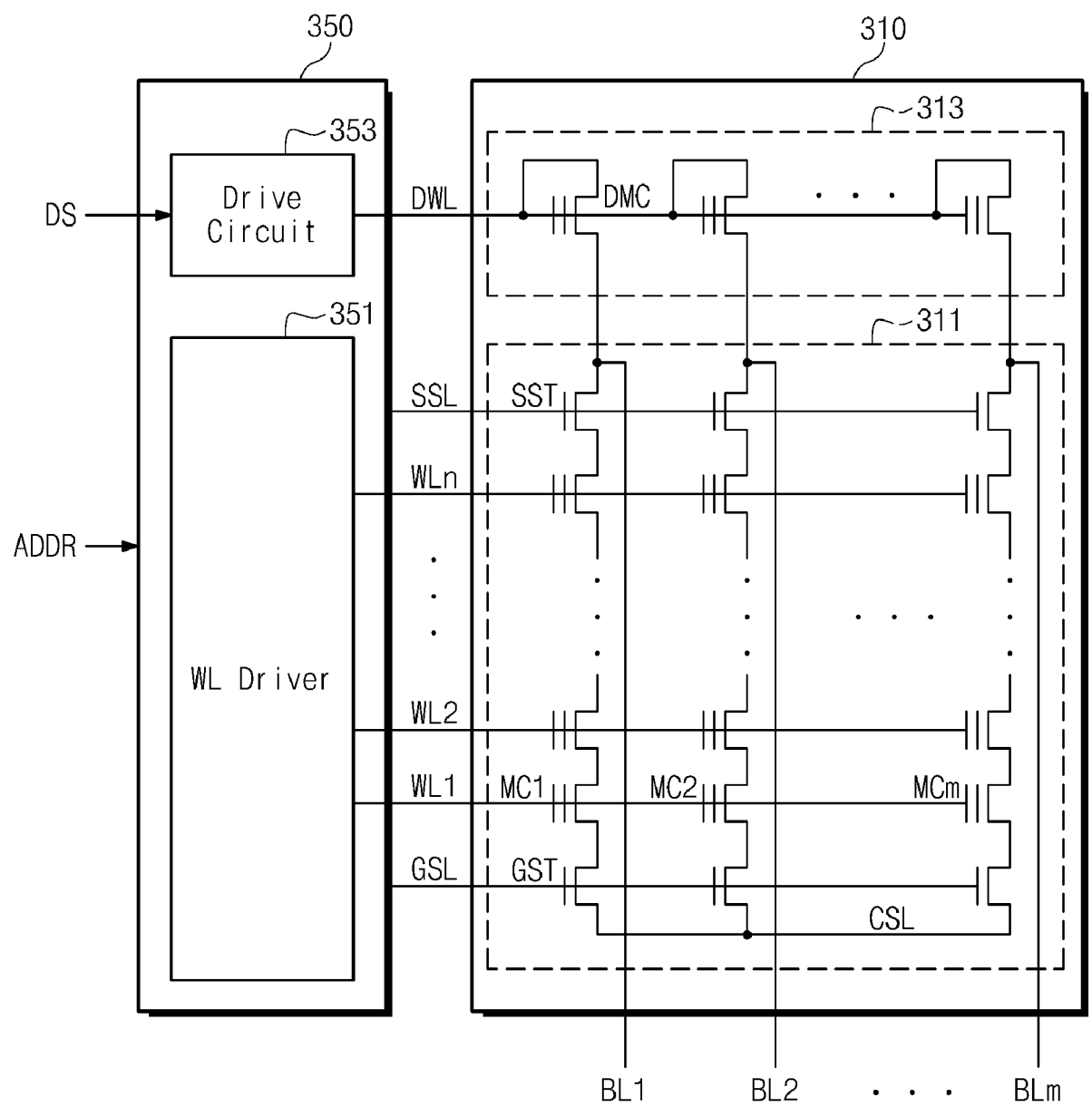
FIG. 8 is a block diagram of a memory cell array and a row decoder shown in FIG. 7 according to an embodiment of the present invention.

FIG. 8 is a block diagram of a memory cell array 310 and a row decoder 350 shown in FIG. 7. The memory cell array 310 and the row decoder 350 are identical to a memory cell array 210 and a row decoder 250 shown in FIG. 4, except that the division circuit 213 shown in FIG. 4 is substituted with a division circuit 313 shown in FIG. 8. That is, unlike the embodiment of FIG. 4, the division circuit 313 of FIG. 8 is positioned at the opposite end of the memory cell array 311. Otherwise, the WL driver 351 and memory cell array 311 function the same as their like-named counterparts of FIG. 4. Thus, duplicate explanations thereof will be omitted to avoid redundancy.

Figure 9:
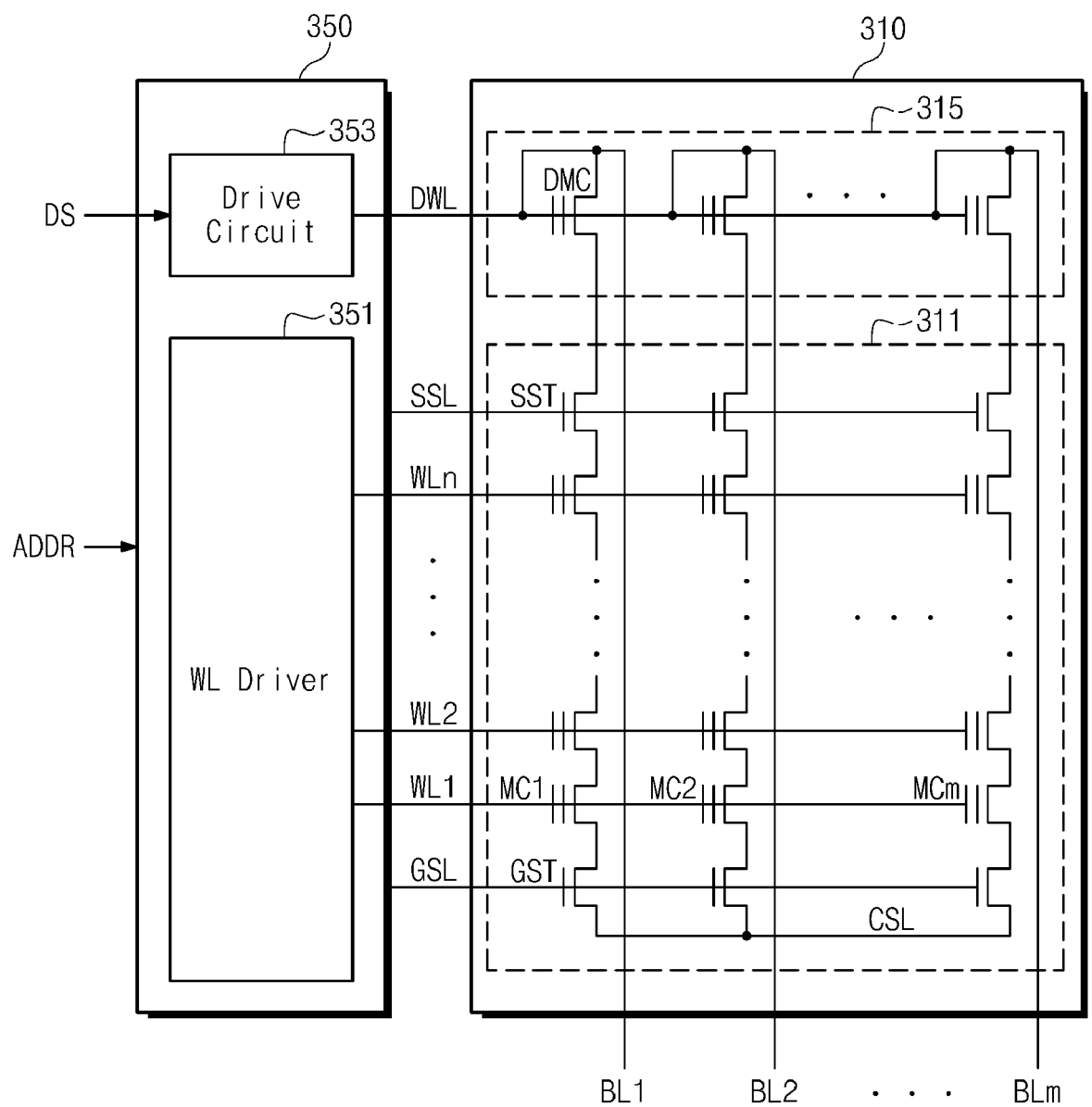
FIG. 9 is a block diagram of another example of the memory cell array and the row decoder shown in FIG. 7 according to an embodiment of the present invention.

FIG. 9 is a block diagram of another example of the memory cell array 310 and the row decoder 350 shown in FIG. 7. The memory cell array 310 and the row decoder 350 are identical to those shown in FIG. 8, except that the division circuit 313 shown in FIG. 8 is substituted with a division circuit 315. Thus, duplicate explanations thereof will be omitted to avoid redundancy.

As shown in FIGS. 8 and 9, dummy memory cells DMC are connected to a string selection transistor SST. In this case, it will be understood that the dummy memory cells DMC is a second string selection transistor and the dummy wordline is a second string selection line.

As illustrated in FIGS. 8 and 9, it will be understood that the division circuits 313 and 315 of the bitline bias circuit 115 according to the present invention may be configured using dummy memory cells DMC adjacent to string selection transistors SST.

As described with reference to FIGS. 3 through 9, the division circuits 213, 215, 313, and 315 of the bitline bias circuit 115 according to embodiments of the present invention may be configured using the dummy memory cells DMC and the dummy wordlines DWL of the memory cell arrays 210 and 310. Further, as described with reference to FIGS. 3 through 9, the division circuits 213, 215, 313, and 315 may include one dummy wordline DWL and dummy memory cells connected to the dummy wordline DWL. However, it will be understood that the division circuits 213, 215, 313, and 315 of the bitline bias circuit 115 according to the present invention may include at least two dummy wordlines DWL and dummy memory cells DMC connected to the dummy wordlines DWL, respectively. Further, it will be understood that the at least two dummy wordlines DWL may be disposed adjacent to each other or scattered at the memory cell array 310.

Figure 10:
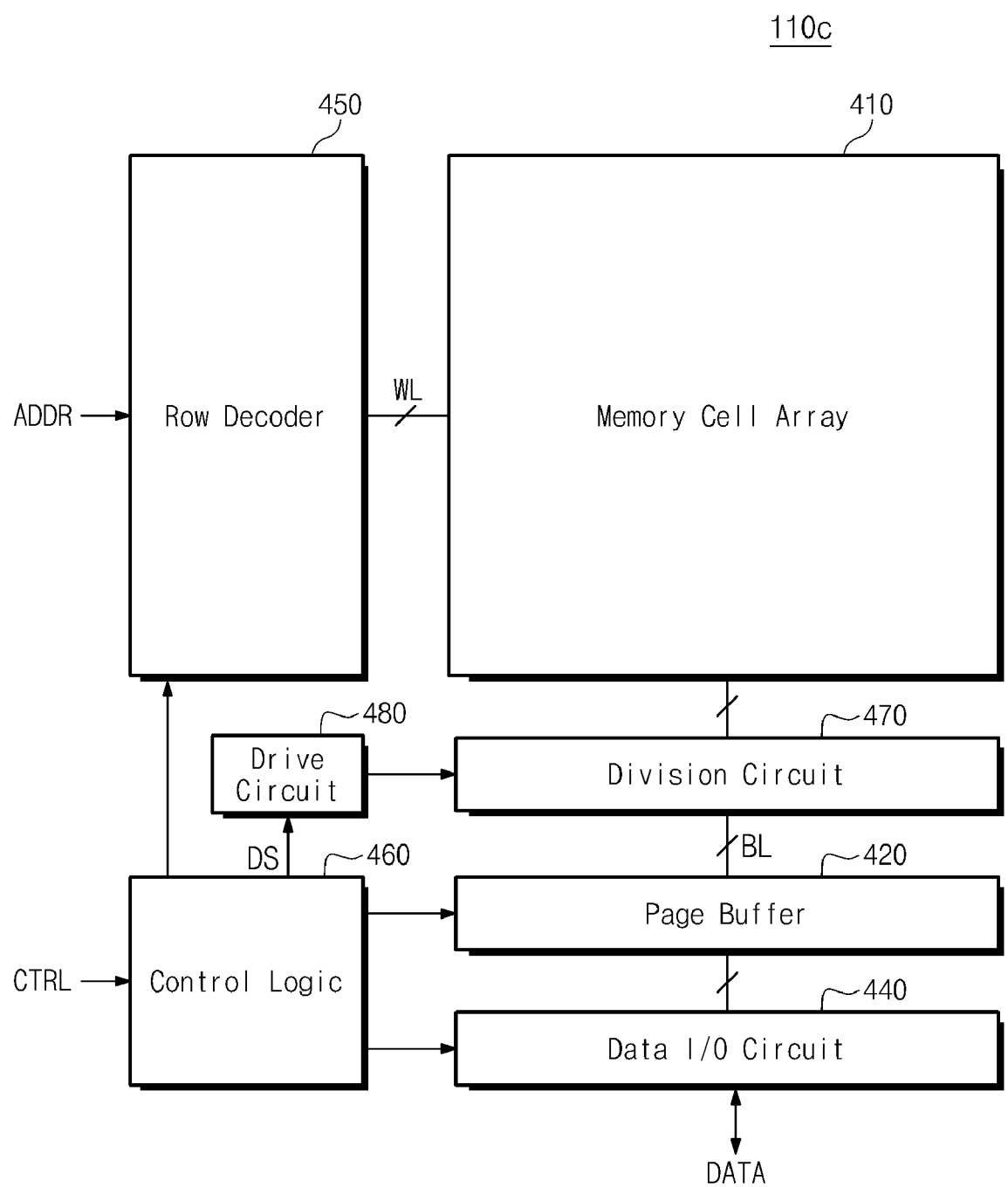
FIG. 10 is a block diagram of a flash memory device according to yet another embodiment of the present invention.

FIG. 10 is a block diagram of a flash memory device 110c according to a third embodiment of the present invention. The flash memory device 110c includes a drive circuit 480 and a division circuit 470. FIG. 10 illustrates an embodiment where the drive circuits 253 and 353 and the division circuits 213, 215, 313, and 315 of the flash memory devices 110a and 110b shown in FIGS. 3 and 7 are disposed outside the row decoders 250 and 350 and the memory cell arrays 210 and 310 to constitute the drive circuit 480 and the division circuit 470, respectively. Otherwise, the control logic 460, row decoder 450, memory cell array 410, page buffer 420, and I/O circuit 440 function the same as their like-named counterparts of the previous embodiments.

Figure 11:
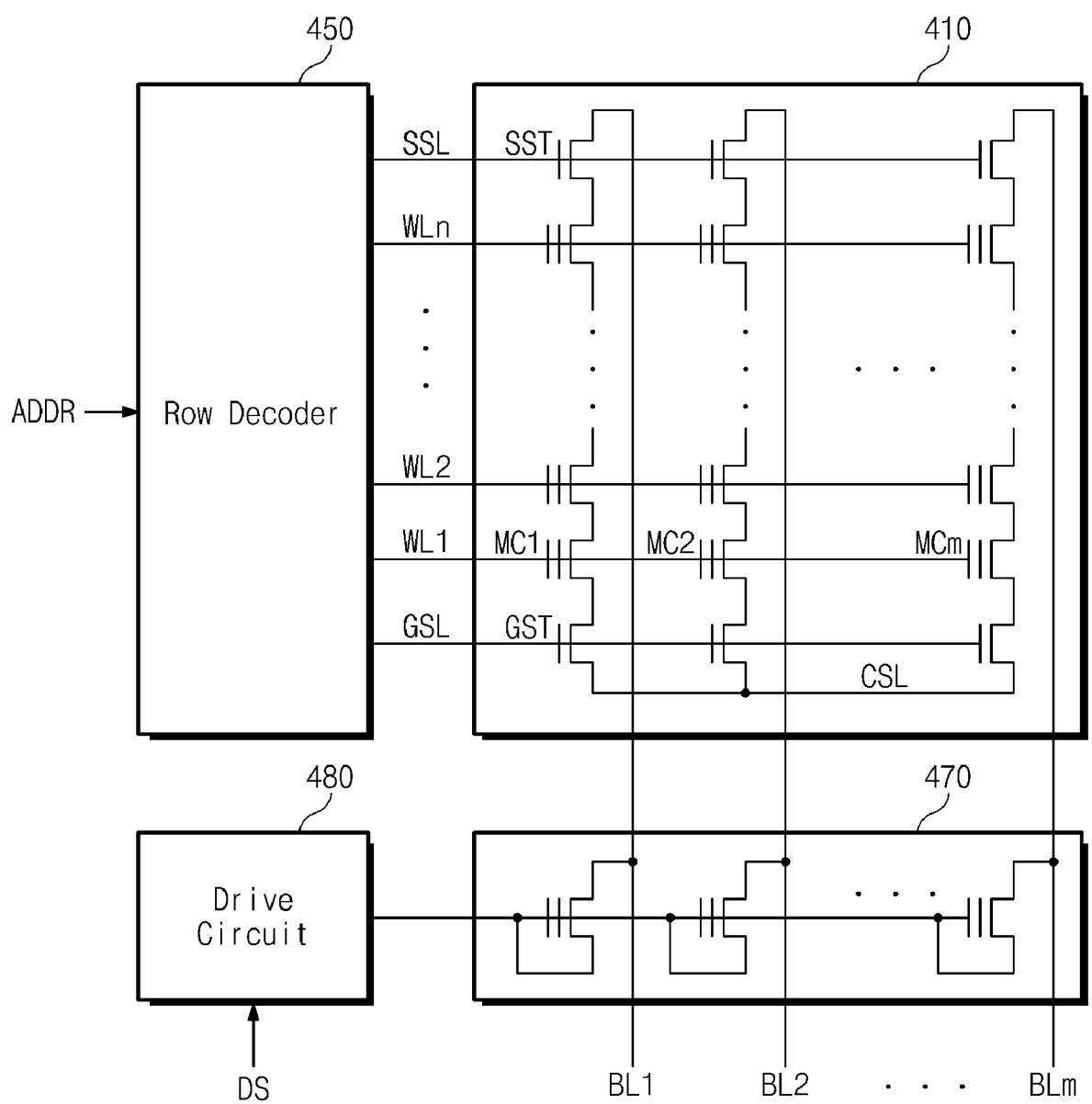
FIG. 11 is a block diagram of a memory cell array, a row decoder, a division circuit, and a drive circuit in the flash memory device shown in FIG. 10 according to an embodiment of the present invention.

FIG. 11 is a block diagram of a memory cell array 410, a row decoder 450, the division circuit 470, and the division circuit 480 of the flash memory device 110c shown in FIG. 10. The components shown in FIG. 11 are identical to those shown in FIG. 4, except that the division circuit 470 and the drive circuit 480 are disposed outside the memory cell array 410 and the row decoder 450, respectively and the division circuit 470 includes a conductive line and diodes constituted of NMOS transistors. Thus, duplicate explanations thereof will be omitted to avoid redundancy.

Figure 12:
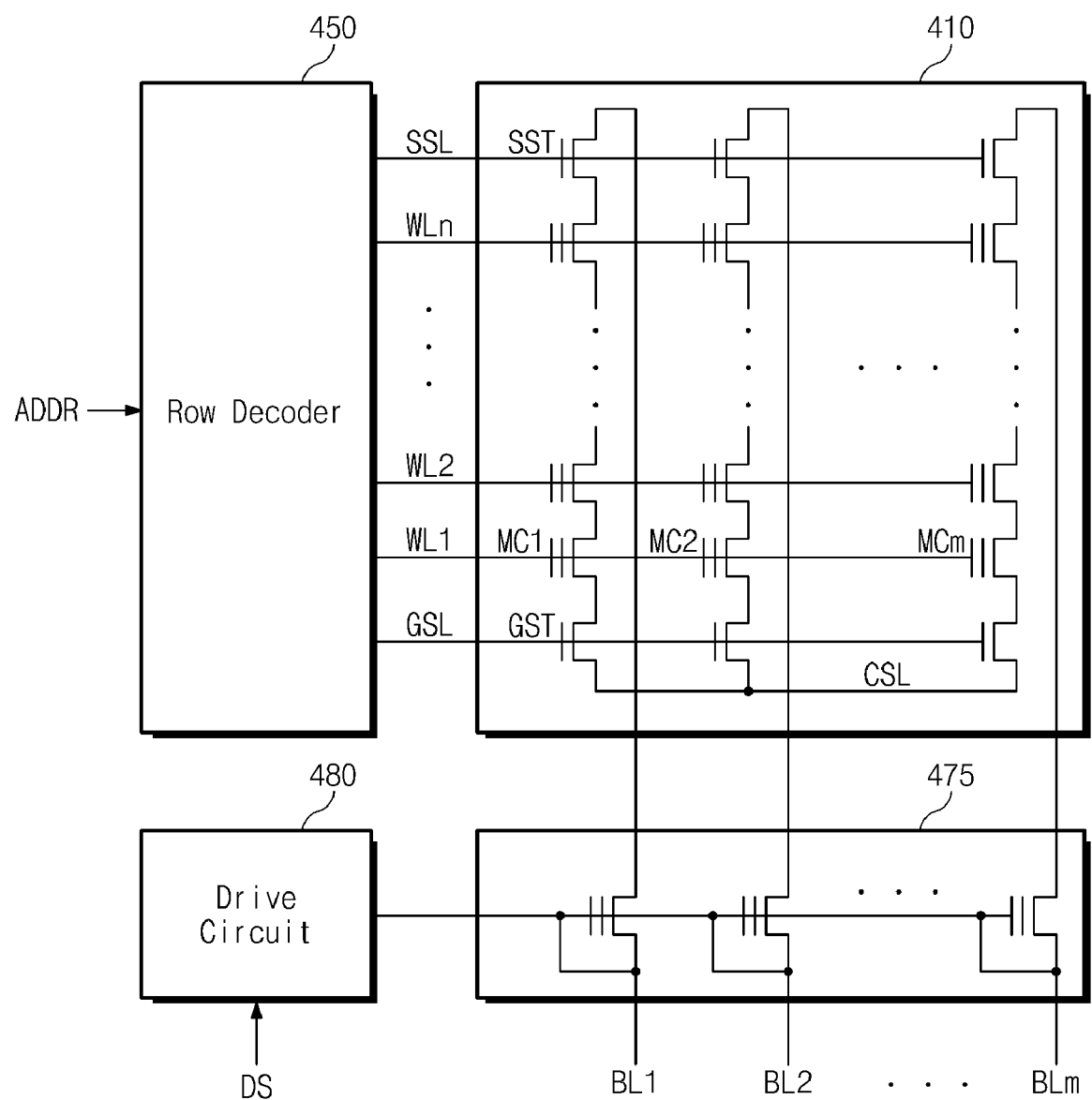
FIG. 12 is a block diagram of another example of the memory cell array, the row decoder, the division circuit, the drive circuit in the flash memory device shown in FIG. 10 according to an embodiment of the present invention.

FIG. 12 is a block diagram of another example of a memory cell array 410, a row decoder 450, the division circuit 475, and a drive circuit 480 of the flash memory device 110c shown in FIG. 10. The components shown in FIG. 12 are identical to those shown in FIG. 6, except that the division circuit 470 and the drive circuit 480 are disposed outside the memory cell array 410 and the row decoder 450, respectively, and the division circuit 470 includes a conductive line and diodes constituted of NMOS transistors. Thus, duplicate explanations thereof will be omitted to avoid redundancy.

As set forth above, a flash memory device according to an embodiment of the present invention includes a plurality of memory cells connected to a wordline and arranged in a row direction, a bitline connected to the respective memory cells, and a bitline bias circuit configured to separately control bias voltages provided to the bitline. Alternatively, the flash memory device includes a plurality of wordlines, a plurality of bitlines intersecting the plurality of wordlines, a wordline driver configured to select the plurality of wordlines, and a bitline bias circuit configured to separately bias the respective bitlines according to distances between the respective bitlines and the wordline driver.

Although the present invention has been described in connection with the foregoing embodiments, it will be understood that the present invention is not limited to these embodiments. Moreover, it will be understood by those skilled in the art that the present invention may be applied to various nonvolatile memory devices such as ROM, PROM, EPROM, EEPROM, flash memory devices, PRAM, MRAM, RRAM, and FRAM.

As set forth in the foregoing embodiments, a nonvolatile memory device biases bitlines by using a bitline bias circuit including a driver circuit and a division circuit. However, the nonvolatile memory device is not limited to the foregoing. In an exemplary embodiment, the nonvolatile memory device may bias bitlines by means of a page buffer. The page buffer may bias bitlines by dividing a power supply voltage Vcc or by using a forcing circuit for setting program pass to program fail. In another exemplary embodiment, the nonvolatile memory device may bias bitlines by means of a column pass gate of a data input/output circuit. The column pass gate may receive a bias voltage from a control logic and provide the bias voltage to corresponding bitlines through a page buffer.

Figure 13:
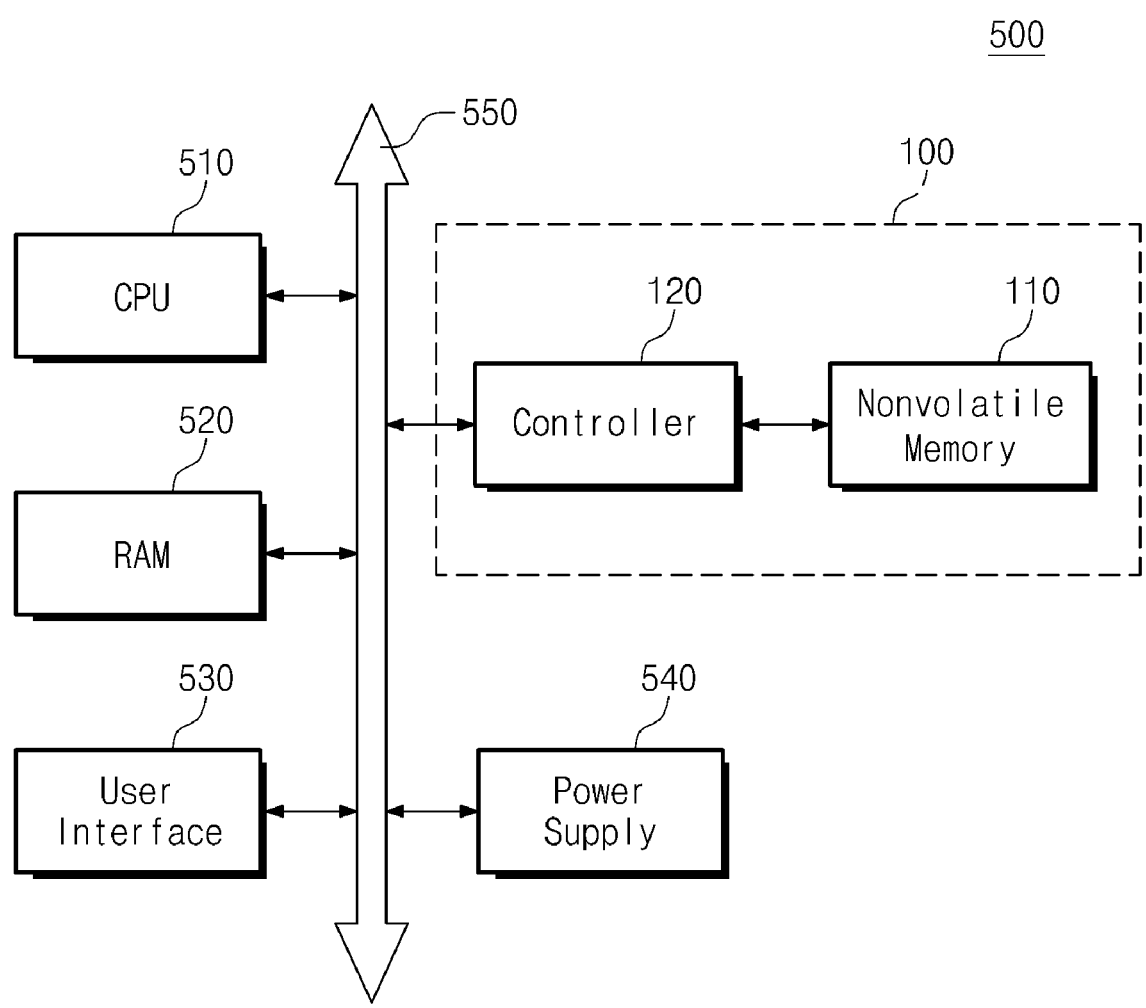
FIG. 13 is a block diagram of an example of a computing system including the memory system shown in FIG. 1 according to an embodiment of the present invention.

FIG. 13 is a block diagram of an example of a computing system 500 including the memory system shown in FIG. 1. The computing system 500 includes a central processing unit (CPU) 510, a RAM 520, a user interface 530, a power supply 540, and a memory system 100.

The memory system 100 is electrically connected to the CPU 510, the RAM 520, the user interface 530, and the power 540 through a system bus 560. Data provided through the user interface 530 or processed by the CPU 510 is stored in the memory system 100. The memory system 100 includes a controller 120 and a nonvolatile memory device 110.

In case a solid-state disk (SSD) is equipped with the memory system 100, booting speed of the computing system 500 may be dramatically enhanced. Although not shown in the figure, it will be understood by those skilled in the art that the computing system 100 may further include an application chipset and a camera image processor.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A nonvolatile memory device comprising:
a plurality of memory cells connected to a wordline and arranged in a row direction;
a plurality of bitlines connected to the plurality of memory cells, respectively;
a wordline driver connected to the word line and configured to apply a voltage to the wordline; and
a bitline bias circuit connected to the bitlines and configured to separately apply bias voltages to the bitlines according to respective locations of the memory cells along the row direction,
wherein a level of a first bias voltage applied to a first bitline, which is closest to the wordline driver among the plurality of bit lines, is higher than a level of a second bias voltage applied to a second bitline, which is farthest from the wordline driver among the plurality of bitlines.

2. A nonvolatile memory device comprising:
a plurality of wordlines;
a plurality of bitlines intersecting the plurality of wordlines;
a wordline driver configured to apply program voltage to a selected wordline and pass voltage to unselected wordlines among the plurality of wordlines during a program operation; and
a bitline bias circuit configured to separately apply bias voltages to the respective bitlines according to respective locations of the respective bitlines during the program operation,
wherein a level of a first bias voltage applied to a first bitline, which is closest to the wordline driver among the plurality of bit lines, is higher than a level of a second bias voltage applied to a second bitline, which is farthest from the wordline driver among the plurality of bitlines.

3. The nonvolatile memory device of claim 2, wherein the bitline bias circuit comprises:
a drive circuit configured to output a preset voltage; and
a division circuit configured to divide the preset voltage to output the bias voltages to the respective bitlines.

4. The nonvolatile memory device of claim 3,
wherein the division circuit comprises a dummy wordline and a plurality of dummy memory cells connected to the dummy wordline and the bitlines.

5. The nonvolatile memory device of claim 4, wherein a control gate and a charge storage layer of the respective dummy memory cells are electrically connected to each other.

6. The nonvolatile memory device of claim 4, wherein a source region of the respective dummy memory cells is electrically connected to a corresponding control gate.

7. The nonvolatile memory device of claim 6, wherein a drain region of the respective dummy memory cells is electrically connected to a corresponding bitline.

8. The nonvolatile memory device of claim 3, wherein the division circuit comprises:
a conductive line having the same configuration as each of the plurality of wordlines and intersecting the plurality of bitlines; and
a plurality of diodes electrically connected to the conductive line and the respective bitlines.

9. The nonvolatile memory device of claim 2,
wherein the bitline bias circuit biases bitlines connected to memory cells to be programmed.

10. The nonvolatile memory device of claim 2, further comprising:
a page buffer connected to the plurality of bitlines and configured to additional bias voltages to the bitlines in addition to the bias voltage of the bitline bias circuit according to write data during the program operation.

11. The nonvolatile memory device of claim 2, wherein the bitline bias circuit equalizes a difference between a wordline voltage and a bitline voltage applied to the respective memory cells.

12. The nonvolatile memory device of claim 2, wherein the bitline bias circuit is activated during a program operation.

13. The nonvolatile memory device of claim 2, further comprising:
string selection transistors connected to the respective bitlines;
ground selection transistors connected to a common source line; and
memory cells coupled between the string selection transistors and the ground selection transistor,
wherein the bitline bias circuit biases a voltage lower than a program inhibit voltage to bit lines connected to memory cells to be programmed.

14. A memory system comprising:
a nonvolatile memory device; and
a controller configured to control the nonvolatile memory device,
wherein the nonvolatile memory device comprises:
a memory cell array including a plurality of wordlines and a plurality of bitlines;
a row decoder configured to select the plurality of wordlines; and
a bitline bias circuit configured to separately bias the respective bitlines according to respective locations of the respective bitlines during a program operation,
wherein a level of a first bias voltage applied to a first bitline, which is closest to the wordline driver among the plurality of bit lines, is higher than a level of a second bias voltage applied to a second bitline, which is farthest from the wordline driver among the plurality of bitlines.

15. The memory system of claim 14, wherein the controller communicates with an external host.

16. The memory system of claim 14, wherein the nonvolatile memory device and the controller are integrated into one semiconductor device.

17. The memory system of claim 14, wherein the nonvolatile memory device and the controller constitute a solid-state disk (SSD).

18. The memory system of claim 14, wherein the nonvolatile memory device and the controller constitute a memory card.

* * * * *